(12) United States Patent
Otsubo et al.

(10) Patent No.: US 6,750,977 B2
(45) Date of Patent: Jun. 15, 2004

(54) APPARATUS FOR MONITORING THICKNESS OF DEPOSITED LAYER IN REACTOR AND DRY PROCESSING METHOD

(75) Inventors: Toru Otsubo, Fujisawa (JP); Tatehito Usui, Chiyoda (JP)

(73) Assignee: Hitachi, Ltd., Tokyo (JP)

( * ) Notice: Subject to any disclaimer, the term of this patent is extended or adjusted under 35 U.S.C. 154(b) by 335 days.

(21) Appl. No.: 09/855,674

(22) Filed: May 16, 2001

(65) Prior Publication Data

US 2001/0043984 A1 Nov. 22, 2001

(30) Foreign Application Priority Data

May 16, 2000 (JP) ........................................ 2000-143961

(51) Int. Cl.[7] .............................. G01B 11/06; G01J 3/30; B05C 11/00; H01L 21/00; G01L 21/30
(52) U.S. Cl. ....................... 356/632; 356/311; 356/316; 118/712; 118/713; 438/9; 438/707; 134/1; 134/31; 216/60; 216/66; 216/67
(58) Field of Search ................................. 356/632, 311, 356/316; 118/712, 713; 438/9, 707; 134/1, 31; 216/60, 66, 67

(56) References Cited

U.S. PATENT DOCUMENTS 5,536,359 A * 7/1996 Kawada et al.
5,843,232 A * 12/1998 Savkar et al.
5,897,378 A * 4/1999 Eriguchi
5,985,032 A * 11/1999 Eriguchi
6,124,927 A * 9/2000 Zhong et al.

FOREIGN PATENT DOCUMENTS

| JP | 61-183919 | 8/1986 |
| JP | 8-276657 | 10/1996 |
| JP | 9-036102 | 2/1997 |
| JP | 11-297629 | 10/1999 |

* cited by examiner

*Primary Examiner*—Frank G. Font
*Assistant Examiner*—Khaled Brown
(74) *Attorney, Agent, or Firm*—Antonelli, Terry, Stout & Kraus, LLP

(57) ABSTRACT

A dry processing apparatus includes a processing chamber provided with a measurement window having a reflection portion which totally reflects light on the side of an inner surface thereof and a transmission portion. When a layer is not deposited, measurement light is irradiated so that the light is totally reflected by the reflection portion. A deviation between the measurement light reflected by a surface of the deposited layer and the measurement light reflected by the reflection portion is measured to determine a thickness of the deposited layer. A quantity of light reflected by the surface of the deposited layer is compared with the light quantity in case where irregularities are not formed in the surface of the deposited layer to evaluate a state of irregularities of the surface. The thickness of the deposited layer and a state of the surface of the layer are monitored separately.

8 Claims, 3 Drawing Sheets

APPARATUS FOR MONITORING THICKNESS OF DEPOSITED LAYER IN REACTOR AND DRY PROCESSING METHOD

CROSS-REFERENCE TO RELATED APPLICATION

This application relates to U.S. patent application Ser. No. to be assigned based on Japanese Patent Application No. 11-343385 filed Dec. 2, 1999 entitled "Measuring Apparatus and Layer Forming Processing Method" by t. Ohtsubo et al., the disclosure of which is incorporated herein by reference.

BACKGROUND OF THE INVENTION

The present invention relates to an apparatus for monitoring a state of an inner wall surface of a processing chamber in layer forming and processing operation such as processing of forming thin film, etching processing of forming minute patterns on thin film or the like in the fabrication of devices such as semiconductor devices and liquid crystal devices having combined minute thin film patterns and a method of forming and processing a layer by means of a layer forming and processing apparatus incorporated with the monitoring apparatus.

In the layer forming processing and the minute pattern forming processing used in the fabrication of semiconductor devices or liquid crystal devices, a deposited layer is formed on an inner wall surface of a processing chamber during the processing. When a thickness of the deposited layer is increased, dust is produced by exfoliation of the deposited layer and it is difficult to attain the layer forming processing with high accuracy.

As a method of monitoring a layer deposited on the inner wall surface of the processing chamber, for example, JP-A-9-36102 and JP-A-11-140655 disclose a method of irradiating the inside of the processing chamber with measurement light from one window formed in the processing chamber and measuring the measurement light emitted from the other window formed in the processing chamber to monitor a state of the deposited layer on the basis of variation of the measurement light.

However, even when the deposited layer is not thick, there is a possibility that the deposited layer is peeled off if a state of irregularities of a surface of the deposited layer is remarkable. Accordingly, if not only a thickness of the deposited layer but also the state of the surface can be detected, it can be exactly judged whether cleaning of the inner wall surface of the processing chamber is required or not.

However, in a measuring method of the deposited layer disclosed in the above documents, the measurement light passing through the windows formed in the processing chamber is influenced by both of a thickness of the layer deposited on the windows and scattering of the measurement light due to irregularities formed in the surface of the deposited layer and both of them cannot be detected separately. Accordingly, the state of the deposited layer in the processing chamber cannot be monitored with high accuracy.

SUMMARY OF THE INVENTION

It is a first object of the present invention to provide a monitoring apparatus capable of monitoring a thickness of a deposited layer formed on an inner wall surface of a processing chamber and a state of a surface of the deposited layer separately.

It is a second object of the present invention to provide a dry processing method and a dry processing apparatus for monitoring a thickness of a deposited layer formed on an inner wall surface of a processing chamber and a state of a surface of the deposited layer separately and cleaning the inner wall surface of the processing chamber at a proper time before dust is produced in the processing chamber. The present invention is to solve at least one of the above objects.

In order to achieve the above object, according to an aspect of the present invention, a monitoring apparatus for detecting a thickness of a layer deposited on an inner wall surface of a processing chamber of a dry processing apparatus, comprises a measurement window formed in the inner wall surface of the processing chamber and which can transmit light, a device for irradiating the measurement window with measurement light at an incident angle that the measurement light is totally reflected by an inner surface of the measurement window on the side of the inner wall surface of the processing chamber, a detection device for focusing the measurement light reflected by the inner surface of the measurement window and a surface of the layer deposited on the inner surface of the measurement window to detect the measurement light, and a device for evaluating the layer deposited on the inner surface of the measurement window on the basis of a detection result of the detection device.

In the above aspect of the present invention, a reflection portion which reflects the measurement light and a transmission portion which transmits the measurement light are formed on the inner surface of the measurement window on the side of the inner wall surface of the processing chamber, and the evaluation device evaluates the deposited layer on the inner surface on the basis of the measurement light reflected by the reflection portion formed on the inner surface and the measurement light which the transmission portion transmits and is reflected by the surface of the layer deposited on the inner surface. Alternatively, a reflection and transmission layer which reflects part of the measurement light and which transmits the remaining part of the measurement light is formed on the inner surface of the measurement window on the side of the inner wall surface of the processing chamber, and the evaluation device evaluates the deposited layer on the inner surface on the basis of the measurement light reflected by the reflection and transmission layer formed on the inner surface and the measurement light which the reflection and transmission layer transmits and is reflected by the surface of the layer deposited on the inner surface.

In order to achieve the above object, according to another aspect of the present invention, a dry processing method of generating discharge in a processing chamber in a predetermined gas atmosphere to process an object to be processed so that a deposit produced in the processing chamber is cleaned, comprises irradiating a measurement window, which is formed in an inner wall surface of the processing chamber and can transmit light, with measurement light at an incident angle that the measurement light is totally reflected by an inner surface of the measurement window, focussing the measurement light reflected by the inner surface of the measurement window and a surface of a layer deposited on the inner surface to detect the measurement light, evaluating the layer deposited on the inner surface of the measurement window on the basis of the detected and reflected light of the measurement light, and deciding a time of cleaning the deposit produced in the processing chamber on the basis of the evaluation of the deposited layer.

In order to achieve the above object, according to still another aspect of the present invention, a dry processing apparatus for generating discharge in a processing chamber in a predetermined gas atmosphere to process an object to be processed so that a deposit produced in the processing chamber is cleaned, comprises a measurement window which is formed in an inner wall surface of the processing chamber and can transmit light, a device for irradiating the measurement window with measurement light at an incident angle that the measurement light is totally reflected by an inner surface of the measurement window on the side of an inner wall surface of the processing chamber, a detection device for focusing the measurement light reflected by the inner surface of the measurement window and a surface of a layer deposited on the inner surface to detect the measurement light, and a device for evaluating the layer deposited on the inner surface of the measurement window on the basis of the detection result of the detection device and deciding a time of cleaning the deposit produced in the processing chamber on the basis of the evaluation of the deposited layer.

In the above aspect of the present invention, a reflection portion which reflects the measurement light and a transmission portion which transmits the measurement light are formed on the inner surface of the measurement window on the side of the inner wall surface of the processing chamber, and the evaluation device calculates a thickness of the deposited layer on the inner surface on the basis of a deviation between an optical axis of the measurement light reflected by the reflection portion formed on the inner surface and an optical axis of the measurement light which the transmission portion transmits and which is reflected by the surface of the layer deposited on the inner surface and judges a state of irregularities of the surface of the deposited layer on the basis of the calculated thickness and a quantity of the measurement light reflected by the reflection portion.

DETAILED DESCRIPTION OF THE EMBODIMENT

Figure 1:
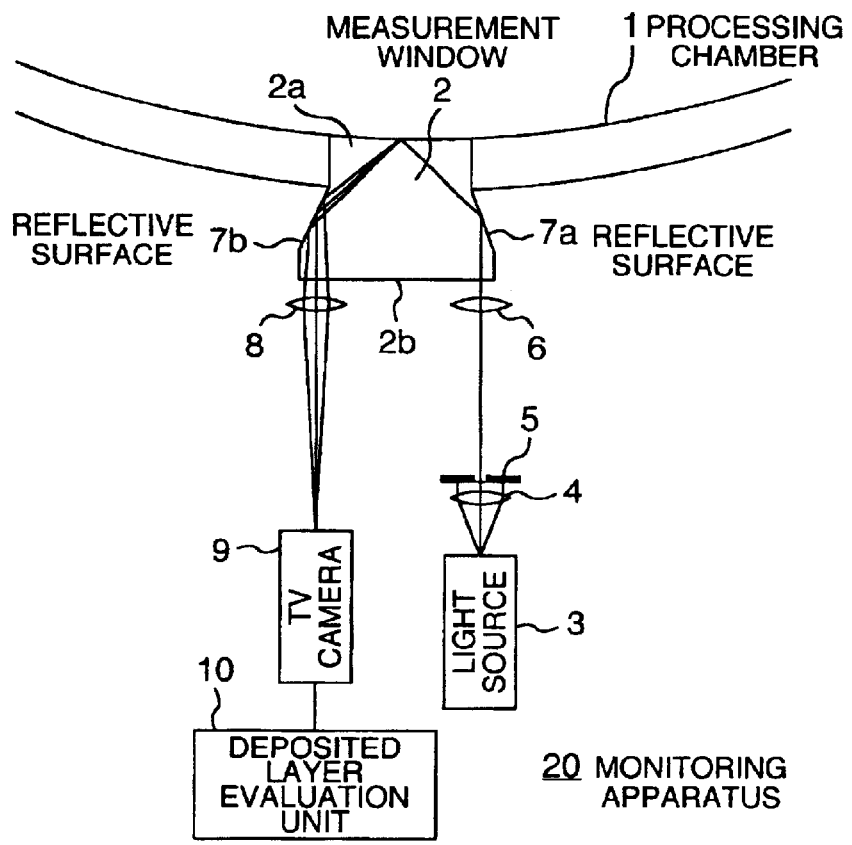
FIG. 1 is a schematic diagram illustrating an embodiment of a monitoring apparatus included in a dry processing apparatus according to the present invention.

An embodiment of the present invention is now described with reference to FIGS. 1 to 5. FIG. 1 is a diagram schematically illustrating a monitoring apparatus according to an embodiment of the present invention. FIG. 5 is a diagram schematically illustrating a dry processing apparatus including the monitoring apparatus shown in FIG. 1. The dry processing apparatus is applied to a plasma processing apparatus by way of example.

Referring now to FIG. 5, a substrate or base 26 to be processed is disposed on a stage 25 within a plasma processing chamber 21 of a dry processing apparatus 30. Electric power is supplied from a radio-frequency power supply 23 to an electrode 24 so that the substrate 26 is subjected to plasma processing. The electrode 24 is insulated from an inner wall of the plasma processing chamber 21 by an insulator member 22. A monitoring apparatus 20 for monitoring a state of a deposited layer in the plasma processing chamber 21 is attached to the plasma processing chamber 21.

Referring now to FIG. 1, the monitoring apparatus 20 is described. A measurement window 2 is mounted in an inner wall surface of a processing chamber 1 of the plasma processing apparatus 30. The measurement window 2 is made of material having a refractive index that a total reflection condition of light emitted from the measurement window 2 into vacuum is 44 degrees or more. Reflective surfaces 7a and 7b are disposed symmetrically to each other on both sides of the measurement window 2. The refractive surface 7a is disposed so that measurement light incident vertically on a surface 2b of the measurement window 2 is reflected by the reflective surface 7a and the reflected light is incident on a surface 2a facing to the processing chamber 1 at 45 degrees.

An incident angle of the measurement light on the reflective surface 7a is 67.5 degrees and the light is totally reflected to be incident on the surface 2a. The measurement light totally reflected by the surface 2a is set to be incident on the reflective surface 7b at 67.5 degrees.

Figure 3:
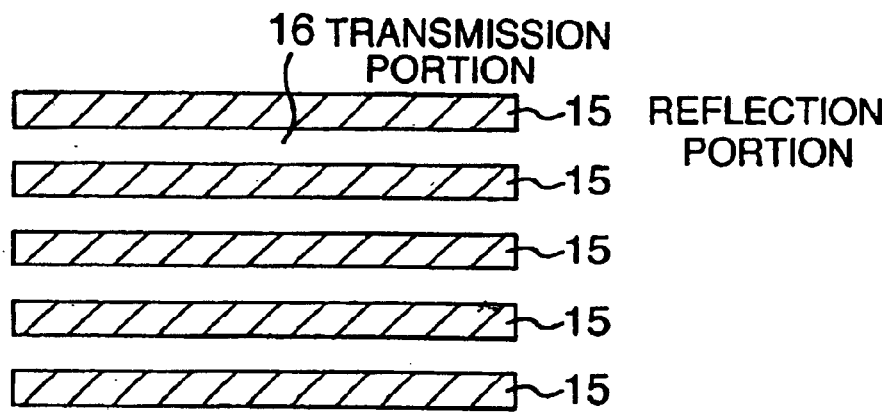
FIG. 3 shows an example of a pattern formed in a measurement window.

The measurement light emitted from a light source 3 impinges on a slit 5 through a lens 4, so that the measurement light having a pattern of the slit 5 passes through a lens 6 and is incident vertically on the surface 2b of the measurement window 2. The measurement light incident on the surface 2b is reflected by the reflective surface 7a to be focused on the surface 2a of the measurement window 2. The pattern shown in FIG. 3 is formed in the focused area of the surface 2a. The pattern has a plurality of rectangular reflection portions 15 and transmission portions 16 formed between the reflection portions 15. At least one rectangular slip pattern is also formed in the slit 5. The slit pattern formed in the slit 5 is orthogonally set to the rectangular patterns formed on the surface 2a.

The measurement light reflected by the surface 2a is reflected by the reflective surface 7b and passes through the surface 2b so that its optical axis is vertical to the surface 2b. The light passing through the surface 2b is focused on an image sensor of a TV camera 9 by means of a lens 8. A deposited layer in the processing chamber 1 is evaluated on the basis of an image focused on the image sensor of the TV camera 9 by a deposited layer evaluation unit 10. When etching processing, CVD processing or the like is performed in the processing chamber 1, a deposited layer of reactive product is formed on the inner wall surface of the processing chamber 1. Accordingly, a similar deposited layer of reactive product is also formed on the surface 2a of the measurement window 2.

Figure 2:
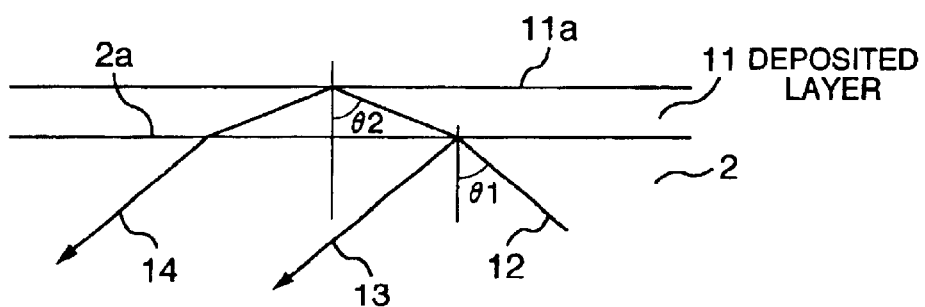
FIG. 2 is a diagram explaining optical paths of measurement light in a portion where a deposited layer is attached in the monitoring apparatus shown in FIG. 1.

As shown in FIG. 2, when a deposit layer 11 is formed on the surface 2a of the measurement window 2, measurement light irradiating the transmission portion 16 in the surface 2a along an optical axis 12 is not totally reflected by an interface between the measurement window 2 and the deposited layer 11 but is totally reflected by a surface 11a of the deposited layer to be returned along a path defined by an optical axis 14.

More particularly, the measurement light passing through the transmission portion 16 of the pattern formed in the surface 2a of the measurement window 2 is reflected by the surface 11a of the deposited layer so that the light passes along the path defined by the optical axis 14, while the measurement light irradiating the reflection portion 15 of the surface 2a is reflected thereby so that the light passes along a path defined by an optical axis 13. Such reflected light is reflected by the reflective surface 7b so that the light is focused on the image sensor of the TV camera 9 by means of the lens 8.

Figure 4:
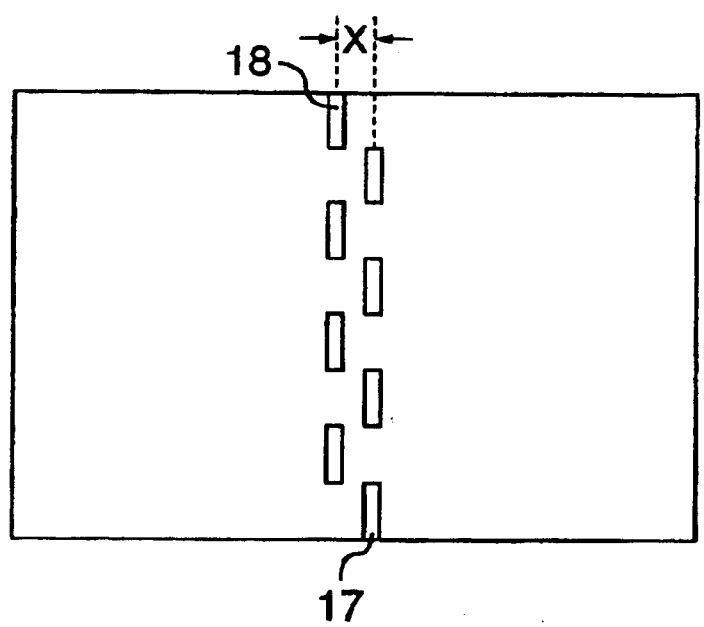
FIG. 4 shows an example of a detected image.
Figure 5:
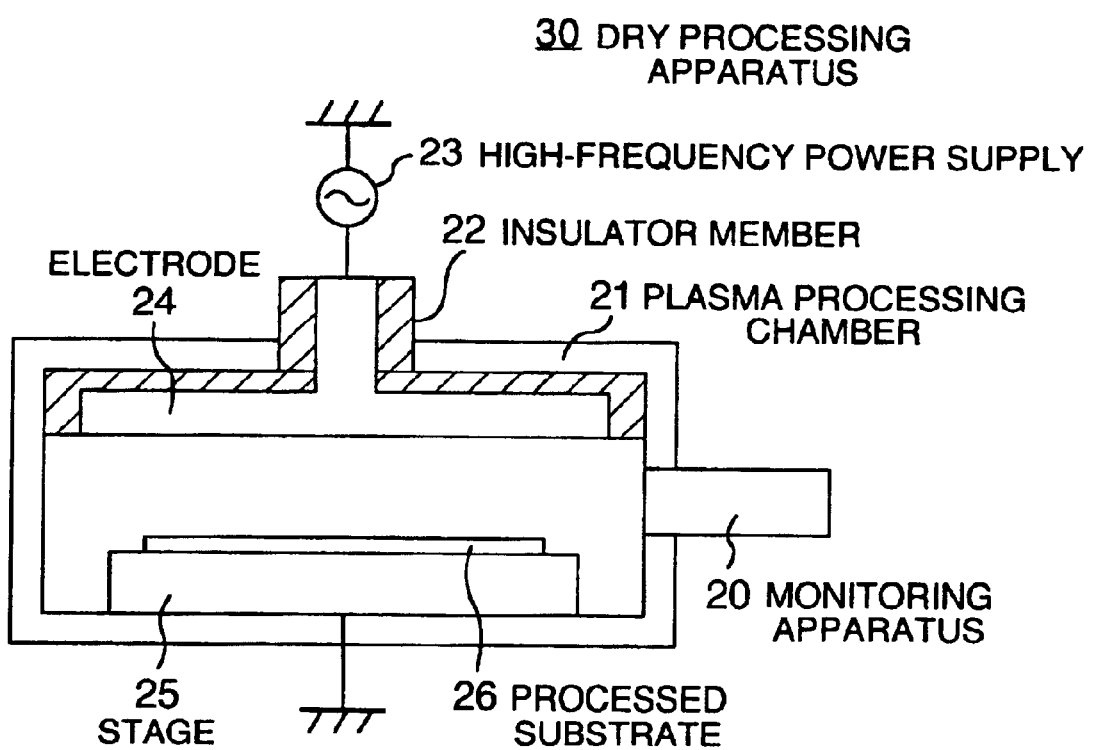
FIG. 5 schematically illustrates the dry processing apparatus in which the monitoring apparatus shown in FIG. 1 is provided.

A picture shown in FIG. 4 is a monitoring screen of signal outputted from the TV camera 9. That is, the measurement light reflected by the reflection portion 15 and passing along the path of the optical axis 13 appears as a pattern 17 on the monitoring screen and the measurement light passing along the path of the optical axis 14 appears as a pattern 18 on the monitoring screen.

In the above embodiment, since the measurement light is totally reflected by the surface 11a of the deposited layer, a difference in light quantity between the patterns 17 and 18 is not large. However, when the measurement light is not totally reflected, that is, when part of the measurement light is transmitted from the surface 11a of the deposited layer into the inside of the processing chamber 1, the light reflected by the deposited layer 11 is about 1/100 of a quantity of light from the reflection portion 15, so that it cannot be detected with high accuracy. Thus, when the measurement light is set to be totally reflected by the surface 11a of the deposited layer, the difference in light quantity between the patterns 17 and 18 is small and the light quantity is large. Accordingly, high-accuracy detection can be attained.

In the deposited layer evaluation unit 10, in order to calculate a thickness of the deposited layer, an amount of deviation x (shown in FIG. 4) between the patterns 17 and 18 is first measured and a distance between the optical axes 13 and 14 is calculated on the basis of a magnification of the lens 8 and a magnification defined between the image sensor and the monitoring screen.

The distance between the optical axes can be expressed by "2d tan θ2* cos θ1" when the thickness of the deposited layer is "d". "θ1" is an angle between the optical axis 12 and the perpendicular line to the surface 2a as shown in FIG. 2 and is set to 45 degrees in the embodiment. "θ2" is an angle between the measurement light emitted from the surface 2a and a perpendicular light to the surface 11a of the deposited layer and is determined by the refractive index of the deposited layer 11.

The thickness of the deposited layer 11 is previously measured in a sample of the specific condition by means of a step measuring device or the like and "θ2" can be calculated from the relation of the thickness and the distance between the optical axes. The thickness of the deposited layer 11 can be measured from the distance x between the optical axes on the basis of the calculated angle "θ2". The thickness of the deposited layer 11 can be measured with accuracy of 0.1 micron by calculating the distance between the patterns 17 and 18 with high accuracy by means of the image processing.

The surface 11a of the deposited layer has irregularities growing as the thickness of the deposited layer 11 is increased. That is, difference of the irregularities is remarkable. Since the growing of the irregularities causes production of dust, it is necessary to evaluate the thickness of the deposited layer and the irregularities of the surface in order to forecast the production of dust.

When the irregularities of the surface 11a of the deposited layer have grown, the measurement light is scattered by the irregularities to thereby reduce the rate of the measurement light totally reflected by the surface 11a of the deposited layer. Accordingly, a difference in the light quantity between the patterns 17 and 18 occurs. The difference occurs due to two factors including (1) a state of the surface of the deposited layer and (2) absorption of the measurement light while the measurement light passes through the deposited layer. In the embodiment, the absorption of the measurement light during passing through the layer can be corrected from the measured result of the thickness of the deposited layer 11 on the basis of the relation of the light quantity of the reflected light and the thickness in case where there is no irregularity on the surface of the deposited layer 11 and the state of the surface of the deposited layer 11 can be judged. Thus, the thickness and the state of the surface of the deposited layer 11 can be monitored independently of each other.

When the irregularities of the surface of the deposited layer 11 are large, there is an increased possibility that production of dust is increased even if the thickness of the deposited layer is thin. In the embodiment, the state of the irregularities of the surface can be monitored by the monitoring apparatus 20 independently to thereby decide a cleaning time with higher accuracy in the deposited layer evaluation unit 10.

When the cleaning time is decided by the monitoring apparatus 20, cleaning is performed by means of the dry processing apparatus 30 of FIG. 5. That is, tetrafluoromethane (preferably methane tetrafluoride+oxygen gas) is introduced into the plasma processing chamber 21 of the dry processing apparatus 30 to generate discharge in the processing chamber 21 so that the deposited layer is removed. When the deposited layer evaluation unit 10 decides the cleaning time, a display unit may be provided to display it (with displayed characters, sign, alarm or the like).

As described above, according to the embodiment, the pattern of the total reflection portions 15 and the transmission portions 16 is formed on the inner surface 2a of the processing chamber 1 where the measurement window 2 is formed. When the layer 11 is not deposited, the inner surface 2a is irradiated with the measurement light on condition that the light is totally reflected by the inner surface 2a. When the deposited layer 11 is formed on the inner surface 2a, the measurement light passes through the inner surface 2a. A deviation x between the measurement light reflected by the surface 11a of the deposited layer 11 and the measurement light reflected by the reflection portion 15 of the inner surface 2a is measured so that the thickness of the deposited layer 11 is measured. Further, a quantity of the light reflected by the surface 11a of the deposited layer 11 is compared with the light quantity in case where the irregularities are not formed in the surface 11a to evaluate the state of irregularities of the surface 11a. Thus, the monitoring apparatus capable of monitoring the thickness of the deposited layer formed on the inner wall surface of the processing chamber and state of the surface of the deposited layer separately can be realized.

Further, there can be realized the dry processing method and the dry processing apparatus which perform cleaning of the inner wall surface of the processing chamber at a proper time before dust is produced in the processing chamber by monitoring the thickness of the deposited layer formed on the inner wall surface of the processing chamber and the state of the surface of the deposited layer separately by means of the monitoring apparatus.

In the embodiment, the pattern shown in FIG. 3 is formed on the surface 2a of the measurement window 2, although the present invention is not limited thereto. Any system which can obtain the reflected light from the surface 2a of the measurement window 2 and the totally reflected light from the surface of the deposited layer 11 may be employed. A system in which a layer is formed in the surface 2a and the layer reflects part of the incident light (measurement light) toward the surface 2a and transmits the remaining part of the incident light can be also employed. In this case, two lines are detected as a main pattern and a space between the lines can be measured to thereby determine the thickness of the deposited layer in the same manner as the example shown in the drawings.

The length of the pattern 15 formed in the surface 2a may be any length as far as a satisfactory image can be obtained in the range of visual field of the TV camera 9. Even when the pattern 15 or the like is not formed on the surface 2a, small reflected light can be obtained from the surface 2a after the deposited layer 11 has been formed and accordingly even a method of increasing the detection sensitivity of the reflected light can be used to measure the thickness of the deposited layer.

Moreover, in the embodiment, the incident angle of the measurement light on the surface 2a is set to 45 degrees, although the incident angle is not limited to this angle. The incident angle may be set to any angle on condition that the measurement light is totally reflected on condition that the deposited layer 11 is not attached to the surface 2a of the measurement window 2 and the measurement light is not totally reflected at the interface between the deposited layer 11 and the measurement window 2 to pass through the deposited layer 11 after the deposited layer 11 is attached.

Furthermore, when the deposited layer 11 is not deposited in the measurement window 2, the measurement light is incident on the measurement window 2 to be totally reflected the measurement light at the surface 2a of the measurement window 2. Therefore, when the deposited layer 11 is deposited on the surface 2a, the measurement light is totally reflected at the deposited layer surface 11a of the inner wall of processing chamber 1 regardless of the refractive index of the deposited layer 11. As a result, the measurement light passes through without being incident on the processing chamber 1 and it is detected by reflection totally at the surface 2a.

According to the present invention, there can be realized the monitoring apparatus which can monitor the thickness of the deposited layer formed on the inner wall surface of the processing chamber and the state of the surface of the layer separately. Further, there can be realized the dry processing method and the dry processing apparatus which perform cleaning of the inner wall surface of the processing chamber at a proper time before dust is produced in the processing chamber by monitoring the thickness of the deposited layer formed on the inner wall surface of the processing chamber and the state of the surface of the deposited layer separately by means of the monitoring apparatus.

Accordingly, in the fabrication of devices such as semiconductor devices and liquid crystal devices having combined minute thin film patterns, dust can be prevented to be increased and production with higher yield can be attained. The reliability of semiconductor devices, liquid crystal devices and the like can be improved.

In the present invention, the measurement light is emitted from the outside of the measurement window where the deposited layer is formed, at the incident angle that the measurement light is totally reflected by the inner surface of the processing chamber where the measurement window is formed and the positional relation of the reflected light from the inner surface of the measurement window and the measurement light which is totally reflected by the surface of the layer deposited on the inner wall surface of the measurement window is measured to thereby calculate the thickness of the deposited layer. At this time, when the irregularities of the surface of the deposited layer are increased, the light totally reflected by the surface of the deposited layer is reduced. Reduction of the reflected light due to the increased thickness of the layer can be calculated from the previously measured thickness of the layer to thereby measure reduction of the quantity of the reflected light due to the irregularities of the surface of the deposited layer. Consequently, the thickness of the deposited layer and the state of the surface of the deposited layer can be measured separately.

Since dust produced due to exfoliation of the deposited layer is dependent on the thickness of the deposited layer and the state of the surface of the deposited layer, the production time of dust can be forecasted with high accuracy by measuring the thickness and the state separately and cleaning can be performed at a proper time on the basis of the forecasted result.

What is claimed is:

1. A monitoring apparatus for detecting a thickness of a layer deposited on an inner wall surface of a processing chamber of a dry processing apparatus, comprising:

a measurement window formed in the inner wall surface of the processing chamber and which can transmit light;

means for irradiating said measurement window with measurement light at an incident angle that said measurement light is totally reflected by an inner surface of said measurement window on the side of the inner wall surface of the processing chamber;

detection means for focusing said measurement light passed through inside of the layer deposited on the inner surface of said measurement window and reflected from the inner surface the processing chamber to detect said measurement light; and means for evaluating the layer deposited on the inner surface of said measurement window on the basis of a detection result of said detection means.

2. A monitoring apparatus according to claim 1, wherein a reflection portion which reflects said measurement light and a transmission portion which transmits said measurement light are formed on the inner surface of said measurement window on the side of the inner wall surface of the processing chamber, and said evaluation means evaluates the deposited layer on the inner surface on the basis of said measurement light reflected by said reflection portion formed on the inner surface and said measurement light which said transmission portion transmits and is reflected by the surface of the layer deposited on the inner surface.

3. An monitoring apparatus according to claim 1, wherein a reflection and transmission layer which reflects part of said measurement light and which transmits the remaining part of said measurement light is formed on the inner surface of said measurement window on the side of the inner wall surface of the processing chamber, and said evaluation means evaluates the deposited layer on the inner surface on the basis of said measurement light reflected by said reflection and transmission layer formed on the inner surface and said measurement light which said reflection and transmission layer transmits and is reflected by the surface of the layer deposited on the inner surface.

4. A dry processing method of generating discharge in a processing chamber in a predetermined gas atmosphere to process an object to be processed so that a deposit produced in the processing chamber is cleaned, comprising:

irradiating a measurement window, which is formed in an inner wall surface of the processing chamber and can transmit light, with measurement light at an incident angle that said measurement light is totally reflected by an inner surface of said measurement window on the side of an inner wall surface of the processing chamber;

focussing said measurement light passed through inside of a layer deposited on the inner surface of said measurement window and reflected from the inner surface of the processing chamber to detect said measurement light;

evaluating the layer deposited on the inner surface of said measurement window on the basis of the detected reflected light of said measurement light; and deciding a time of cleaning the deposit produced in the processing chamber on the basis of the evaluation of the deposited layer.

5. A dry processing apparatus for generating discharge in a processing chamber in a predetermined gas atmosphere to process an object to be processed so that a deposit produced in the processing chamber is cleaned, comprising:

a measurement window which is formed in an inner wall surface of the processing chamber and can transmit light;

means for irradiating said measurement window with measurement light at an incident angle that said measurement light is totally reflected by an inner surface of said measurement window on the side of an inner wall surface of the processing chamber;

detection means for focusing said measurement light passed through inside of a aver deposited on the inner surface of said measurement window and reflected from the inner surface of the processing chamber to detect said measurement light; and means for evaluating the layer deposited on the inner surface of said measurement window on the basis of the detection result of said detection means and deciding a time of cleaning the deposit produced in the processing chamber on the basis of the evaluation of the deposited layer.

6. A dry processing apparatus according to claim 5, wherein a reflection portion which reflects said measurement light and a transmission portion which transmits said measurement light are formed on the inner surface of said measurement window formed in the inner wall surface of the processing chamber, and said evaluation means calculates a thickness of the deposited layer on the inner surface on the basis of a deviation between an optical axis of said measurement light reflected by said reflection portion and an optical axis of said measurement light which said transmission portion transmits and which is reflected by the surface of the layer deposited on the inner surface and judges a state of irregularities of the surface of the deposited layer on the basis of the calculated thickness and a quantity of said measurement light reflected by said reflection portion.

7. A monitoring apparatus according to claim 1, wherein a plurality of reflecting patterns with higher reflection factor than the surroundings are disposed through a transmission portion such that the light travels across said patterns to obtain a slit-like light.

8. A monitoring apparatus according to claim 1, further comprising means for receiving the reflected light from said reflecting patterns and the light passed through said deposited layer and reflected from the inner surface of the processing chamber.

* * * * *